(12) United States Patent
Varnoosfaderani

(10) Patent No.: US 12,087,993 B2
(45) Date of Patent: Sep. 10, 2024

(54) BROADBAND AND LOW COST PRINTED CIRCUIT BOARD BASED 180° HYBRID COUPLERS ON A SINGLE LAYER BOARD

(71) Applicant: CommScope Technologies LLC, Hickory, NC (US)

(72) Inventor: Mohammad Vatankhah Varnoosfaderani, Plano, TX (US)

(73) Assignee: Outdoor Wireless Networks LLC, Claremont, NC (US)

( * ) Notice: Subject to any disclaimer, the term of this patent is extended or adjusted under 35 U.S.C. 154(b) by 322 days.

(21) Appl. No.: 17/790,881

(22) PCT Filed: Feb. 9, 2021

(86) PCT No.: PCT/US2021/017224
§ 371 (c)(1),
(2) Date: Jul. 5, 2022

(87) PCT Pub. No.: WO2021/167815
PCT Pub. Date: Aug. 26, 2021

(65) Prior Publication Data
US 2023/0034066 A1   Feb. 2, 2023

Related U.S. Application Data

(60) Provisional application No. 62/978,416, filed on Feb. 19, 2020.

(51) Int. Cl.
*H01P 5/18*     (2006.01)
*H01P 1/20*     (2006.01)
(Continued)

(52) U.S. Cl.
CPC ............ *H01P 5/222* (2013.01); *H01P 1/2002* (2013.01); *H01P 5/184* (2013.01); *H01P 5/227* (2013.01); *H05K 1/113* (2013.01)

(58) Field of Classification Search
CPC ...... H01P 5/12; H01P 5/16; H01P 5/18; H01P 5/184; H01P 5/185; H01P 5/222; H01P 5/225; H01P 5/227
See application file for complete search history.

(56) References Cited

U.S. PATENT DOCUMENTS

2002/0113666 A1\* 8/2002 Yamazaki ................. H01P 5/18
333/109
2007/0103253 A1   5/2007 Napijalo
(Continued)

FOREIGN PATENT DOCUMENTS

CN          203721869 U       7/2014

OTHER PUBLICATIONS

"International Search Report and Written Opinion of the International Searching Authority", International Application No. PCT/US2021/017224, Jun. 1, 2021, 11 pp.
(Continued)

*Primary Examiner* — Stephen E. Jones
(74) *Attorney, Agent, or Firm* — Myers Bigel, P.A.

(57) ABSTRACT

A hybrid coupler includes a 90° hybrid coupler and a first quarter wavelength conductive stub. The 90° hybrid coupler includes a coupling section, a first input transmission line that is coupled to the coupling section, a second input transmission line that is coupled to the coupling section, a first output transmission line that is coupled to the coupling section and a second output transmission line that is coupled to the coupling section. The first quarter wavelength conductive stub is coupled to the second output transmission line.

20 Claims, 9 Drawing Sheets

(51) Int. Cl.
   *H01P 5/22*     (2006.01)
   *H05K 1/11*     (2006.01)

(56) References Cited

U.S. PATENT DOCUMENTS

| | | |
|---|---|---|
| 2014/0159977 A1 | 6/2014 | Jones |
| 2016/0006098 A1 | 1/2016 | Hasegawa et al. |
| 2019/0273315 A1 | 9/2019 | Hu et al. |

OTHER PUBLICATIONS

Chiu, Jui-Chieh, et al., "A 3-dB Quadrature Coupler Suitable for PCB Circuit Design", IEEE Transactions on Microwave Theory and Techniquest, vol. 54, No. 9, Sep. 2006, pp. 3521-3525.

Tang, Xinyi, et al., "Phase-Shifter Design Using Phase-Slope Alignment With Grounded Shunt $\lambda/4$ Stubs", IEEE Transactions On Microwave Theory and Techniques, vol. 58, No. 6, Jun. 2010, pp. 1573-1583.

* cited by examiner

BROADBAND AND LOW COST PRINTED CIRCUIT BOARD BASED 180° HYBRID COUPLERS ON A SINGLE LAYER BOARD

CROSS-REFERENCE TO RELATED APPLICATIONS

The present application is a 35 U.S.C. § 371 national stage application of PCT Application No. PCT/US2021/017224, filed on Feb. 9, 2021, which itself claims priority under 35 U.S.C. § 119 to U.S. Provisional Patent Application Ser. No. 62/978,416, filed Feb. 19, 2020, the entire contents of which are incorporated herein by reference as if set forth fully herein in their entireties.

FIELD

The present invention relates generally to radio frequency ("RF") communications systems and, more particularly, to power dividers/combiners.

BACKGROUND

Power dividers/combiners are widely used in RF communications systems to split RF signals and/or to combine RF signals. Hybrid couplers are one well known type of power divider/combiner. Hybrid couplers are passive devices that couple defined amounts of RF signals that are input at one or more input ports to one or more output ports. Hybrid couplers may be designed to equally or unequally split the power of the RF signals that are input at the one or more input ports thereof.

Hybrid couplers are often implemented as a pair of RF transmission lines that are arranged so that RF energy may couple between the two transmission lines. Both 90° hybrid couplers and 180° hybrid couplers are known in the art. FIG. 1A is a schematic diagram of a conventional 90° hybrid coupler 10 that illustrates the operation thereof. As shown in FIG. 1A, the conventional 90° hybrid coupler 10 includes a first input port 20, a second input port 22, a first output port 24, a second output port 26 and a coupling section 30. A first RF signal $A_1$ may be input at the first input port 20 and a second RF signal $A_2$ may be input at the second input port 22. In response to these RF signals, an RF signal $A_1/2)(0°+ A_2/2$ (90°) is output at the first output port 24, and an RF signal $A_1/2)(90°+A_2/2$ (0°) is output at the second output port 26. Thus, the 90° hybrid coupler 10 equally divides each RF signal input thereto and the two halves of each RF signal that are output from the 90° hybrid coupler 10 are offset from each other by 90° in phase.

FIG. 1B is a schematic diagram of a conventional 180° hybrid coupler 50 that illustrates the operation thereof. As shown in FIG. 1B, the conventional 180° hybrid coupler 50 includes a first input port 60, a second input port 62, a first output port 64, a second output port 66 and a coupling section 70. A first RF signal $A_1$ may be input at the first input port 60 and a second RF signal $A_2$ may be input at the second input port 62. In response to these RF signals, an RF signal $A_1/2)(0°+A_2/2$ (90°) is output at the first output port 64, and an RF signal $A_1/2)(0°)+A_2/2$ (270°) is output at the second output port 66. Thus, the 180° hybrid coupler 50 equally divides each RF signal input thereto and the two halves of the RF signal that is input at the first input port 60 are output in-phase with each other, while the two halves of the RF signal that is input at the second input port 62 are output to be 180° out-of-phase from each other.

FIG. 1C is a schematic diagram of another conventional 180° hybrid coupler 80 which is commonly referred to as a "rat race" 180° hybrid coupler. As shown in FIG. 1C, the rat race 180° hybrid coupler 80 includes a first input port 90, a second input port 92, a first output port 94, and a second output port 96. A first RF signal $A_1$ may be input at the first input port 90 and a second RF signal $A_2$ may be input at the second input port 92. In response to these RF signals, an RF signal $A_1/2)(0°+A_2/2$ (0°) is output at the first output port 94, and an RF signal $A_1/2)(0°+A_2/2$ (180°) is output at the second output port 96. The rat race 180° hybrid coupler 80 tends to have a more narrowband response as compared to the 180° hybrid coupler 50 of FIG. 1B.

Hybrid couplers are often implemented on printed circuit boards, which may reduce cost. Implementing hybrid couplers on a so-called "single layer" printed circuit board that includes a single dielectric substrate with metallization patterns on either side thereof may be particularly advantageous for reducing cost. Hybrid coupler implementations on single layer printed circuit boards, however, typically rely on interdigitated transmission line segments to generate the necessary coupling between the two transmission lines of the hybrid coupler. The amount of coupling is controlled by the distance between the coupled transmission line segments and the extent to which the two transmission lines are positioned to couple with each other. Unfortunately, conventional printed circuit board fabrication techniques typically require a minimum distance between adjacent metallization patterns due to the resolution of the patterning process, and the minimum distance is rather large. This may limit the amount of coupling that can be achieved, and hence single layer printed circuit board implementations may not be well suited for hybrid coupler applications that require strong coupling. In such cases, air stripline implementations may be used in which the coupled lines are printed or otherwise formed on opposed sides of a dielectric, which can result in much higher coupling levels, but this implementation also increases the cost of the hybrid coupler.

SUMMARY

Pursuant to embodiments of the present invention, A 180° hybrid couplers are provided that include a 90° hybrid coupler. The 90° hybrid coupler comprises a coupling section, a first input transmission line that is coupled to the coupling section, a second input transmission line that is coupled to the coupling section, a first output transmission line that is coupled to the coupling section, and a second output transmission line that is coupled to the coupling section. A first quarter wavelength conductive stub is coupled to the second output transmission line.

In some embodiments, a first length of the first output transmission line and a second length of the second output transmission line may differ by one quarter of a wavelength of a frequency within an operating frequency band of the 180° hybrid coupler. For example, the first length of the first output transmission line and the second length of the second output transmission line differ by approximately one quarter of a wavelength of a center frequency of the operating frequency band.

In some embodiments, the 90° hybrid coupler may be implemented in a printed circuit board that includes a single dielectric layer, and/or the 90° hybrid coupler may include a total of three coupled lines in the coupling section that are separated by gaps of at least 0.2 mm.

In some embodiments, the 180° hybrid coupler may further include a second quarter wavelength conductive stub that is coupled to the second output transmission line.

In some embodiments, the first quarter wavelength conductive stub may be open-circuited, while in other embodiments the first quarter wavelength conductive stub may be short-circuited to ground through a conductive via.

In some embodiments, an average width of the first quarter wavelength conductive stub may be less than one third an average width of the second output transmission line.

In some embodiments, the first input transmission line, the second input transmission line, the first output transmission line and the second output transmission line may be implemented on a first metallization layer of a printed circuit board and a second metallization layer of the printed circuit board may include a metallized ground plane layer that underlies the first input transmission line, the second input transmission line, the first output transmission line and the second output transmission line, the metallized ground plane layer including an opening underneath at least a portion of the coupling section. In such embodiments, the first input transmission line may be directly connected to the second output transmission line, and the second input transmission line may be coupled to the first output transmission line by a metallized trace in the opening in the metallized ground plane layer and a pair of conductive vias that extend through a dielectric layer of the printed circuit board. Additionally, the first metallization layer may include a first conductive region on an input side of the coupling section and a second conductive region on an output side of the coupling section, where each of the first and second conductive regions are electrically coupled to the metallized ground plane layer by respective first and second sets of conductive vias that extend through the dielectric layer of the printed circuit board.

In some embodiments, the 180° hybrid coupler may further include a metal pad that is electrically connected to the metallized ground plane layer underneath the coupling section. This metal pad may be part of the second metallization layer of the printed circuit board and may partially fill the opening, or can be a separate structure such as, for example, a reflector of a base station antenna.

Pursuant to further embodiments of the present invention, 180° hybrid couplers are provided that include a 90° hybrid coupler having a first input transmission line, a second input transmission line, a first output transmission line and a second output transmission line, where these 180° hybrid couplers further include a delay line so that a first length of the first output transmission line and a second length of the second output transmission line differ by approximately one quarter of a wavelength of a center frequency of the operating frequency band. The 180° hybrid couplers also include a band pass filter that is implemented along either the first output transmission line or the second output transmission line.

In some embodiments, the band pass filter may comprise at least a first conductive stub that extends from either the first output transmission line or the second output transmission line.

In some embodiments, the first conductive stub may have a length that is approximately one quarter of the wavelength of the center frequency of the operating frequency band.

In some embodiments, the 90° hybrid coupler may be implemented in a printed circuit board that includes a single dielectric layer, the 90° hybrid coupler including a total of three coupled lines in the coupling section that are separated by gaps of at least 0.2 mm.

In some embodiments, the band pass filter may further include a second conductive stub that extends from either the first output transmission line or the second output transmission line, and the second conductive stub may have a length that is approximately one quarter of the wavelength of the center frequency of the operating frequency band.

In some embodiments, the first conductive stub may be open-circuited, while in other embodiments the first conductive stub may be short-circuited to ground through a conductive via.

In some embodiments, an average width of the first conductive stub may be less than one third an average width of the second output transmission line.

In some embodiments, the input and output transmission lines may be implemented on a first metallization layer of a printed circuit board, and a second metallization layer of the printed circuit board may include a metallized ground plane layer that underlies the input and output transmission lines, the metallized ground plane layer including an opening underneath at least a portion of the coupling section.

In some embodiments, the first input transmission line may be directly connected to the second output transmission line, and the second input transmission line may be coupled to the first output transmission line by a metallized trace in the opening in the metallized ground plane layer and a pair of conductive vias that extend through a dielectric layer of the printed circuit board.

In some embodiments, the first metallization layer may include a first conductive region on an input side of the coupling section and a second conductive region on an output side of the coupling section, where each of the first and second conductive regions are electrically coupled to the metallized ground plane layer by respective first and second sets of conductive vias that extend through the dielectric layer of the printed circuit board.

In some embodiments, the 180° hybrid coupler may further include a metal layer that is electrically connected to the metallized ground plane layer underneath the coupling section.

Pursuant to additional embodiments of the present invention, 180° hybrid couplers are provided that include a printed circuit board that has a top metallization layer and a bottom metallization layer and a dielectric layer therebetween, and first and second conductive vias. The top metallization layer includes first and second input transmission lines, first and second output transmission lines, first through third coupling lines and a first conductive stub that is coupled to the second output transmission line. The second coupling line is positioned between the first and third coupling lines. The bottom metallization layer includes a ground plane that extends at least partially underneath the first and second input transmission lines and the first and second output transmission lines, the ground plane including at least one opening underneath at least a portion of the second coupling line. The bottom metallization layer further includes a first metallized trace that is within the at least one opening. The first conductive via electrically connects the first coupling line to the first metallized trace and the second conductive via electrically connects the third coupling line to the first metallized trace.

In some embodiments, a first length of the first output transmission line and a second length of the second output transmission line may differ by approximately one quarter of a wavelength of a center frequency of an operating frequency band of the 180° hybrid coupler.

In some embodiments, the 90° hybrid coupler may be implemented in a printed circuit board that includes a single dielectric layer, the 90° hybrid coupler including a total of three coupling lines that are separated by gaps of at least 0.08 mm.

In some embodiments, the top metallization layer may further include a second conductive stub that is coupled to the second output transmission line.

In some embodiments, the first conductive stub and the second conductive stub may each have a respective length that is approximately one quarter of a wavelength of a center frequency of the operating frequency band.

In some embodiments, the first conductive stub may be short-circuited to ground through a conductive via while in other embodiments the first conductive stub may be open-circuited.

DETAILED DESCRIPTION

Pursuant to embodiments of the present invention, 180° hybrid couplers are provided that can be formed on a printed circuit board that has a single dielectric layer. These 180° hybrid couplers may be relatively inexpensive to manufacture and may exhibit low return loss over a broad bandwidth. Additionally, the 180° hybrid couplers according to embodiments of the present invention may exhibit a nearly constant phase difference between their outputs over a broad bandwidth. The 180° hybrid couplers may include both microstrip transmission lines and coplanar waveguide transmission lines which may allow the couplers to be implemented using a relatively small number of coupled lines, such as three coupled lines. Moreover, the 180° hybrid couplers may be implemented using standard microwave printed circuit boards and fabrication techniques.

Figure 1A:
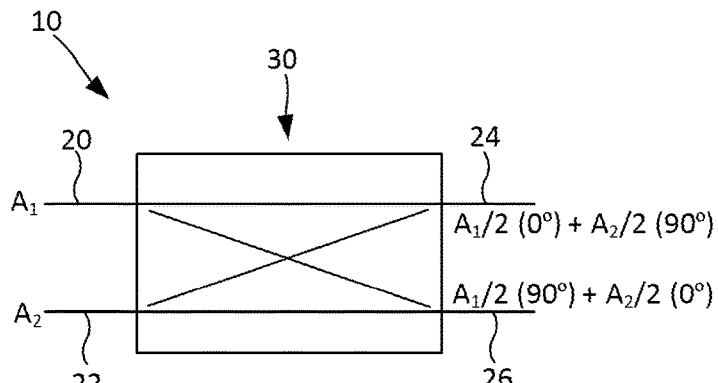
FIG. 1A is a schematic diagram illustrating operation of a conventional 90° hybrid coupler.
Figure 1B:
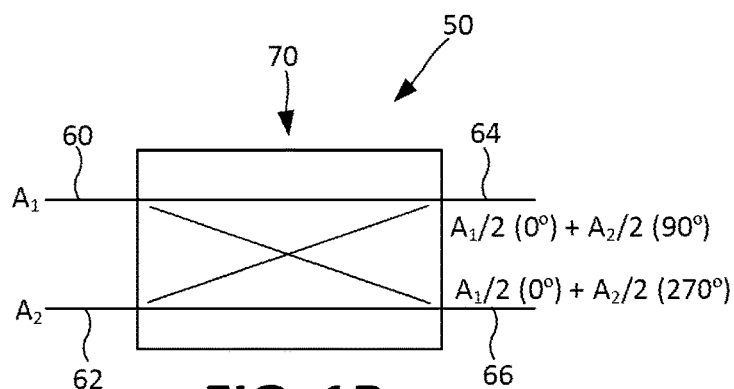
FIG. 1B is a schematic diagram illustrating operation of a conventional 180° hybrid coupler.
Figure 1C:
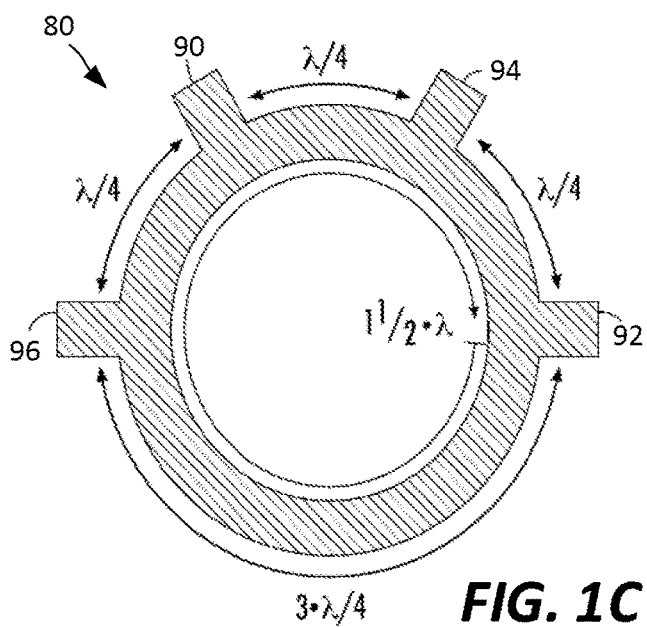
FIG. 1C is a schematic diagram illustrating operation of a conventional rat race 180° hybrid coupler.

In some embodiments, the 180° hybrid coupler may comprise a 90° hybrid coupler that has a 90° delay line integrated into one of the output lines thereof. The 90° delay line may be used to convert the 90° hybrid coupler (which may have the transfer function shown in FIG. 1A) into a 180° hybrid coupler (that may have the transfer function shown in FIG. 1B or one similar thereto). One or more quarter wavelength conductive stubs are coupled to the second output transmission line. The 90° hybrid coupler may include a coupling section that includes a plurality of coupled lines, as well as first and second input transmission lines and first and second output transmission lines that are coupled to the coupling section. The 90° delay line may comprise a quarter wavelength transmission line segment that has a length that is approximately equal to one quarter of a wavelength of the center frequency of the operating frequency band of the 180° hybrid coupler. The 90° hybrid coupler and the 90° delay line may be implemented in a printed circuit board that includes a single dielectric layer. In some embodiments, the 90° hybrid coupler may include a total of three coupled lines in the coupling section, and adjacent ones of these coupled lines may be separated by gaps of at least 0.2 mm.

The quarter wavelength conductive stubs may be open-circuited or may be short-circuited to ground through a conductive via. An average width of each quarter wavelength conductive stub may be less than one third an average width of the second output transmission line in some embodiments. The quarter wavelength conductive stubs may help maintain desired phase differences between the output signals across a broad range of frequencies.

In some embodiments, the first and second input transmission lines, the first and second output transmission lines, and at least a portion of the coupled lines may be implemented on a first metallization layer of a printed circuit board. A second metallization layer of the printed circuit board includes a metallized ground plane layer that underlies the first and second input transmission lines and the first and second output transmission lines. The metallized ground plane layer includes an opening underneath at least a portion of the coupling section. The second metallization layer may also include one or more jumpers that electrically connect non-adjacent ones of the coupling lines.

In some embodiments, the first input transmission line may be directly connected to the second output transmission line, and the second input transmission line may be coupled to the first output transmission line by a jumper in the form of a metallized trace in the opening in the metallized ground plane layer and a pair of conductive vias that extend through a dielectric layer of the printed circuit board. The first metallization layer may also include a first conductive region on an input side of the coupling section and/or a second conductive region on an output side of the coupling section, where each of the first and second conductive regions are electrically coupled to the metallized ground plane layer by respective first and second sets of conductive vias that extend through the dielectric layer of the printed circuit board. The first and second conductive regions may be used to form a coplanar waveguide structure in the coupling section of the 90° hybrid coupler.

In other embodiments, the 180° hybrid coupler may comprise a 90° hybrid coupler having first and second input transmission lines and first and second output transmission lines, where the lengths of the first and second output transmission lines differ by approximately one quarter of a wavelength of a center frequency of the operating frequency band of the 180° hybrid coupler. In these embodiments, a band pass filter is implemented along either the first output transmission line or the second output transmission line. The band pass filter may comprise, for example, one or more conductive stubs that extend from either the first output transmission line or the second output transmission line.

Embodiments of the present invention will now be discussed in further detail with reference to the drawings.

Figure 2A:
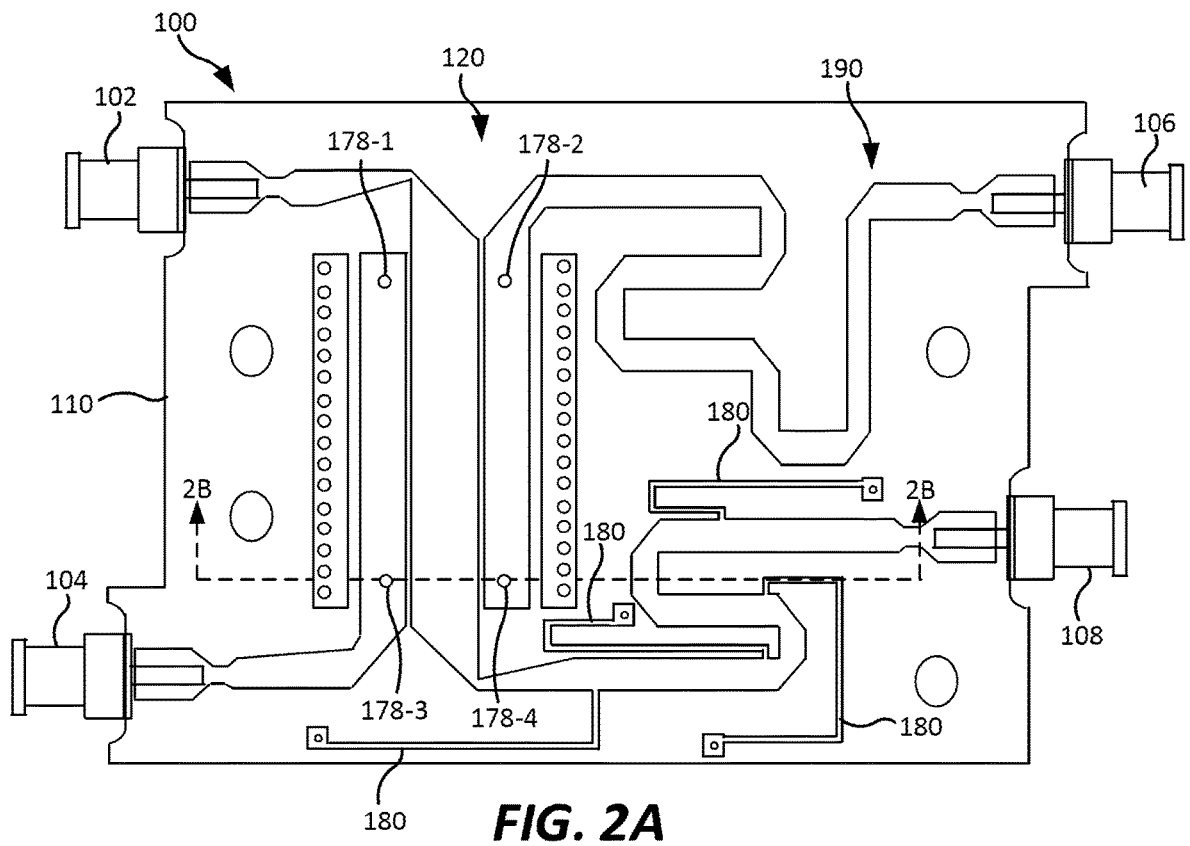
FIG. 2A is a top view of a 180° hybrid coupler according to embodiments of the present invention.
Figure 2B:
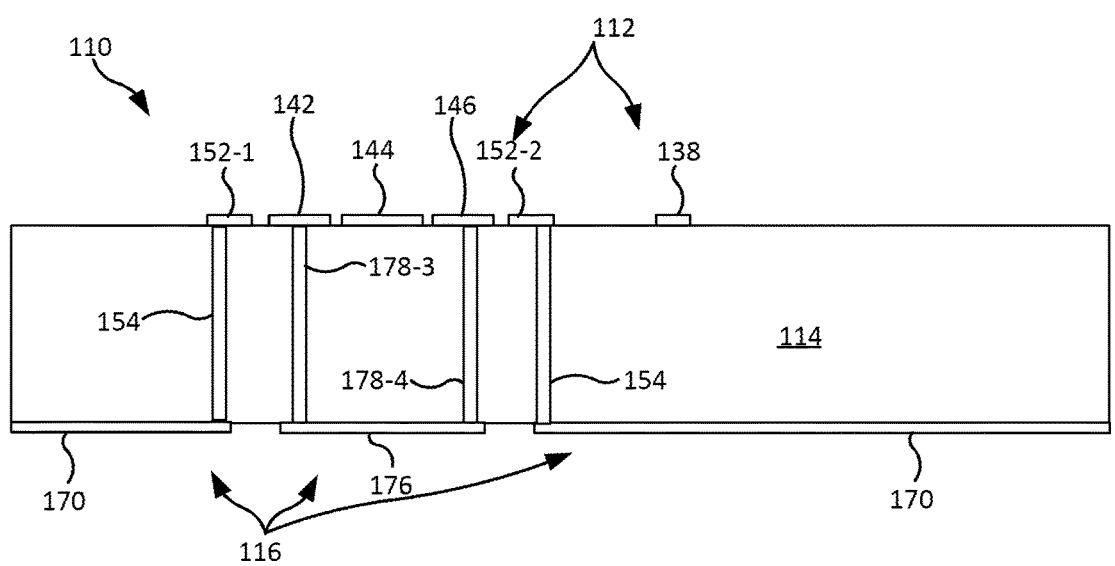
FIG. 2B is a cross-sectional view of a printed circuit board of the 180° hybrid coupler of FIG. 2A taken along line 2B-2B of FIG. 2A.
Figure 2C:
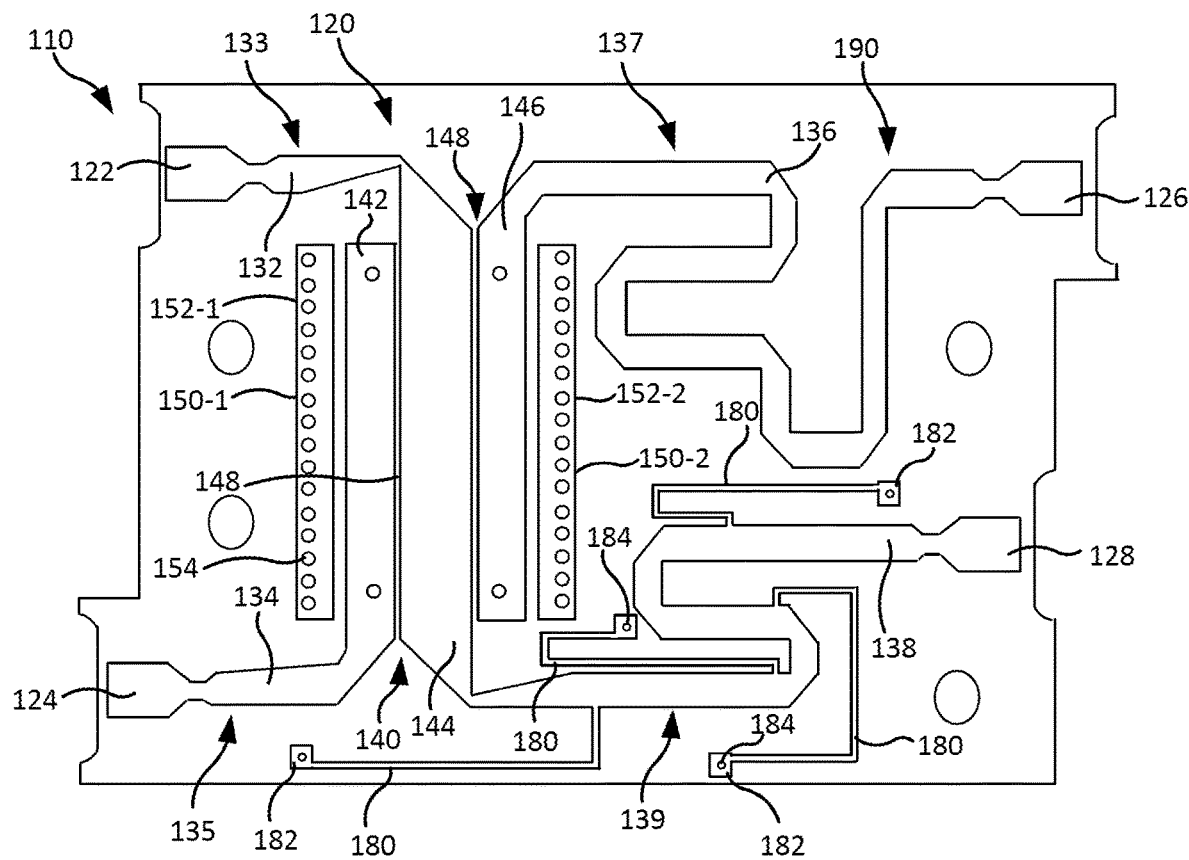
FIG. 2C is a top view of the printed circuit board of FIG. 2B.
Figure 2D:
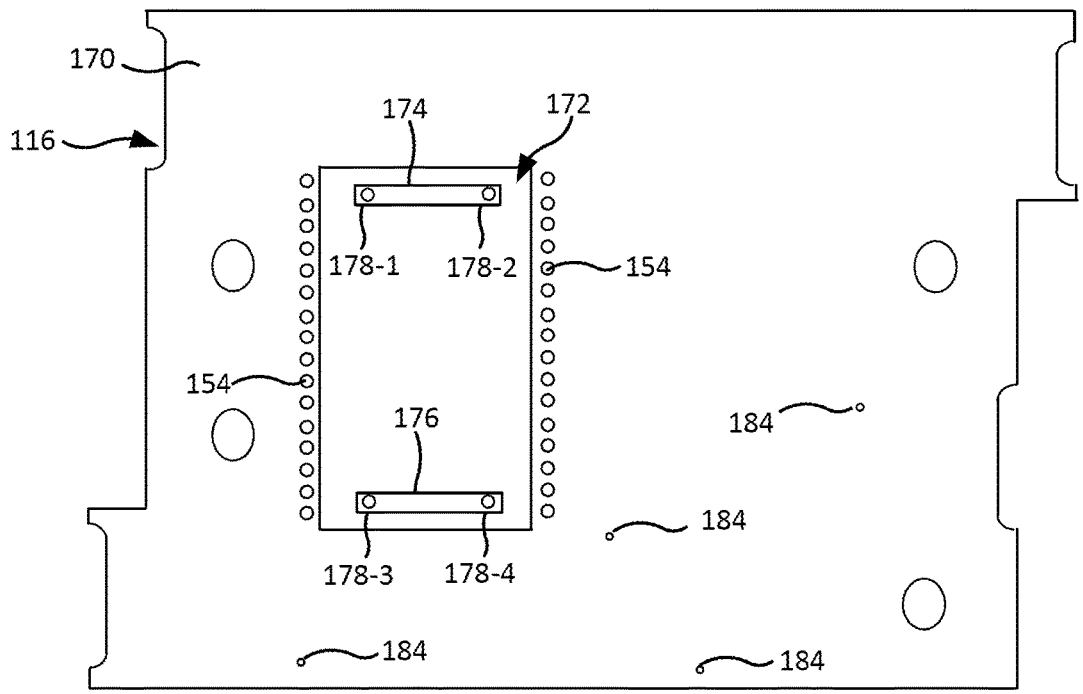
FIG. 2D is a bottom view of the printed circuit board of FIG. 2B.

FIGS. 2A-2D illustrate a 180° hybrid coupler 100 according to certain embodiments of the present invention. In particular, FIG. 2A is a top view of the 180° hybrid coupler 100, and FIGS. 2B-2D are a cross-sectional view, a top view, and a bottom view, respectively, of a printed circuit board 110 that is included in the 180° hybrid coupler 100 of FIG. 2A.

As shown in FIG. 2A, the 180° hybrid coupler 100 is implemented on a printed circuit board 110. In the depicted embodiment, the 180° hybrid coupler 100 includes a 90° hybrid coupler 120 and a delay line 190, both of which are implemented on the printed circuit board 110. Two input coaxial cables 102, 104 and two output coaxial cables 106, 108 are connected to the 180° hybrid coupler 100 and carry RF signals to and from the 180° hybrid coupler 100.

FIG. 2B is a cross-sectional view of the printed circuit board 110 taken along line 2B-2B of FIG. 2A. As shown in FIG. 2B, the printed circuit board 110 includes a dielectric substrate 114 that has a first or "top" metallization pattern 112 on a top side thereof and a second or "bottom" metallization pattern 116 on a bottom side thereof. The dielectric substrate 114 may be a low-loss dielectric substrate having a suitable dielectric constant. In an example embodiment, the dielectric substrate may be a 30 mil ZYF300CA-C substrate. The various components of the first and second metallization patterns 112, 116 will be discussed in further detail below with reference to FIGS. 2B and 2C.

FIG. 2C is a top view of the printed circuit board 110 that illustrates the various structures included in the first metallization pattern 112 in greater detail. As shown in FIG. 2C, the first metallization pattern 112 includes first and second input ports 122, 124 and first and second output ports 126, 128, each of which is implemented as a respective conductive pad. Center conductors of the input and output coaxial cables 102, 104, 106, 108 may be soldered to the respective input and output ports 122, 124, 126, 128.

As is further shown in FIG. 2A, the 90° hybrid coupler 120 is implemented on the printed circuit board 110. The 90° hybrid coupler 120 includes a first input conductive trace 132 that connects to the first input port 122 and a second input conductive trace 134 that connects to the second input port 124. The first and second input conductive traces 132, 134 are each part of the first metallization pattern 112. The first input conductive trace 132 is part of a first input microstrip transmission line 133 that is implemented in the printed circuit board 110, and the second input conductive trace 134 is part of a second input microstrip transmission line 135 that is implemented in the printed circuit board 110. The 90° hybrid coupler 120 includes a first output conductive trace 136 that connects to the first output port 126 and a second output conductive trace 138 that connects to the second output port 128. The first and second output conductive traces 136, 138 also are each part of the first metallization pattern 112. The first output conductive trace 136 is part of a first output microstrip transmission line 137 that is implemented in the printed circuit board 110, and the second output conductive trace 138 is part of a second output microstrip transmission line 139 that is implemented in the printed circuit board 110. As will be discussed below with reference to FIG. 2D, a ground plane layer is formed in the second metallization layer 116 underneath the conductive traces 132, 134, 136, 138 to form the microstrip transmission lines 133, 135, 137, 139.

Still referring to FIG. 2C, the 90° hybrid coupler 120 includes a coupling section 140 that is interposed between the first and second input transmission lines 133, 135 and the first and second output transmission lines 137, 139. In the depicted embodiment, the coupling section 140 includes a total of three coupled lines 142, 144, 146. The coupled lines 142, 144, 146 are also part of the first metallization pattern 112. The coupled lines 142, 144, 146 run parallel to each other and are positioned in close proximity to each other and are separated from each other by small gaps 148. The gaps 148 may be narrow. For example, the gaps 148 may be between 0.08 mm and 0.25 mm in some embodiments. Coupled line 144 is positioned between coupled lines 142 and 146.

The first coupled line 142 is directly connected to the second input conductive trace 134, and the third coupled line 146 is directly connected to the first output conductive trace 136. The second coupled line 144 is directly connected to both the first input conductive trace 132 and the second output conductive trace 138.

Referring to FIG. 2D, it can be seen that the second metallization pattern 116 primarily comprises a ground plane layer 170. The ground plane layer 170 may comprise a mostly solid layer of metal that is formed on the bottom surface of the dielectric substrate 114. An opening 172 is provided in the ground plane layer 170 where the metallization is either not deposited or is deposited and subsequently removed. First and second metal traces 174, 176 are provided within the opening 172. Referring to FIGS. 2A-2D, it can be seen that four conductive vias 178-1 through 178-4 are provided that extend through the dielectric substrate 114. The conductive vias 178 may comprise, for example, plated through-holes or metal-filled through holes. The first conductive via 178-1 electrically connects a distal end of the first coupled line 142 to a first end of the first metal trace 174. The second conductive via 178-2 electrically connects a base end of the third coupled line 146 (i.e., the end that connects to the first output conductive trace 136) to a second end of the first metal trace 174. Thus, the first and second conductive vias 178-1, 178-2 and the first metal trace 174 electrically connect the first coupled line 142 to the third coupled line 146. The third conductive via 178-3 electrically connects a base end of the first coupled line 142 (i.e., the end that connects to the second input conductive trace 134) to a first end of the second metal trace 176. The fourth conductive via 178-4 electrically connects a distal end of the third coupled line 146 to a second end of the second metal trace 176. Thus, the third and fourth conductive vias 178-3, 178-4 and the second metal trace 176 also electrically connect the first coupled line 142 to the third coupled line 146. While a total of two galvanic connections are provided between the first coupled line 142 and the second coupled line 146 in the embodiment depicted in FIGS. 2A-2D, it will be appreciated that a single galvanic connection may be used in other embodiments, while more than two galvanic connections (which may each be implemented in the same manner using a pair of conductive vias and a metal trace in the second metallization pattern 116 or otherwise) may be included in other embodiments. Note that herein when multiple instances of an element are shown in the figures such elements may be referred to using two-part reference numerals. Individual instances of the element may be referred to in the specification using the full reference numeral (e.g., conductive via 178-3) whereas all of the elements may be collectively referred to using the first part of the reference numeral (e.g., the collective vias 178).

The ground plane layer 170 acts as the ground plane for the input and output microstrip transmission lines 133, 135, 137, 139, with the dielectric substrate 114 separating the conductive traces 132, 134, 136, 138 thereof from the ground plane layer 170. The outer conductors of the input and output coaxial cables 102, 104, 106, 108 may be soldered to the ground plane layer 170 to provide a ground reference for the ground plane layer 170.

As discussed above, an opening 172 is provided in the ground plane layer 170 underneath the coupling section 140. As a result, the coupling lines 142, 144, 146 are not microstrip transmission lines, as there is not a ground plane layer underneath the conductive traces forming the coupled lines 142, 144, 146 in the first metallization layer 112. The lack of an underlying ground plane layer may allow RF energy to radiate from the 180° hybrid coupler 100, which may disadvantageously increase the insertion loss of the device. In order to reduce such leakage, first and second coplanar waveguide segments 150-1, 150-2 are formed on the input and output sides of the coupling section 140, respectively. The first coplanar waveguide segment 150-1 comprises a ground trace 152-1 that is formed in the first metallization pattern 112 on the top side of dielectric substrate 114. The ground trace 152-1 overlaps at least partially with the ground plane layer 170 on the lower side of the dielectric substrate 114. A first plurality of conductive vias 154 extend through the dielectric substrate 114 to electrically connect the ground trace 152-1 to the ground plane layer 170. The second coplanar waveguide segment 150-2 comprises a ground trace 152-2 and a second plurality of conductive vias 154 and is designed identically to the first coplanar waveguide structure 150-1 (but rotated 180°). The first and second coplanar waveguide segments 150-1, 150-2 allow the coupled lines 142, 144, 146 to operate as coplanar waveguides, thereby reducing RF leakage and improving the insertion loss of the device.

The coplanar waveguide sections 150 may also facilitate increased coupling between the coupled lines 140, 142, 146. In particular, since the coupled lines 140, 142, 146 operate as coplanar waveguides, the widths of these lines are not constrained (due to impedance matching concerns) by the thickness and dielectric constant of the dielectric substrate 114. Accordingly, the coplanar waveguide structures 150 may be spaced apart from the coupled lines 140, 142, 146 by distances that allow for lines having thicker widths that result in increased coupling. Moreover, since coupled lines 142 and 146 can be galvanically connected to each other using the conductive vias 154 and the first and second metal traces 174, 176, bond wires are not required to galvanically connect coupled lines 142 and 146. Thus, the 90° hybrid coupler 120 may have a very compact design, may be implemented on a printed circuit board 110 that has a single dielectric substrate 114, and may be free of bond wires.

The first and second output transmission lines 137, 139 are each implemented as meandered microstrip transmission lines. This allows the physical length of the 180° hybrid coupler 100 to be reduced while allowing the first and second output transmission lines 137, 139 to have desired electrical lengths. In the depicted embodiment, the first output transmission line 137 includes a delay line 190 that is incorporated into the first output transmission line 137. As a result of the addition of the delay line 190, the first output transmission line 137 is electrically longer than the second output transmission line 139. In example embodiments, the first output transmission line 137 may be approximately one quarter of a wavelength longer than the second output transmission line 139, where the "wavelength" refers to the wavelength corresponding to the center frequency of the operating frequency band of the 180° hybrid coupler 100. The extra quarter wavelength in the first output transmission line 137 provides an extra phase shift to RF signals that are output at the first output pad 126. For RF signals at the center of the operating frequency band, this extra phase shift will be approximately 90°.

Referring to FIGS. 2A and 2C, a plurality of conductive stubs 180 are coupled to the second output conductive trace 138. Each conductive stub 180 is approximately a quarter of a wavelength long where the term "wavelength" refers to the wavelength corresponding to the center frequency of the operating frequency band of the 180° hybrid coupler 100. Each quarter wavelength conductive stub 180 terminates into a respective conductive pad 182. Respective conductive vias 184 are formed in each conductive pad that extend through the dielectric substrate 114 to electrically connect the conductive pads 182 to the ground plane layer 170. As can be seen in FIGS. 2A and 2C, an average width of each conductive stub 180 is much smaller than an average width of the second output transmission line 139 (as well as the other input and output transmission lines 133, 135, 137). The width is smaller in order to provide a high impedance. In some embodiments, an average width of each conductive stub 180 may be less than one third an average width of the second output transmission line 139. In other embodiments, an average width of each conductive stub 180 may be less than one fifth an average width of the second output transmission line 139.

Figure 2E:
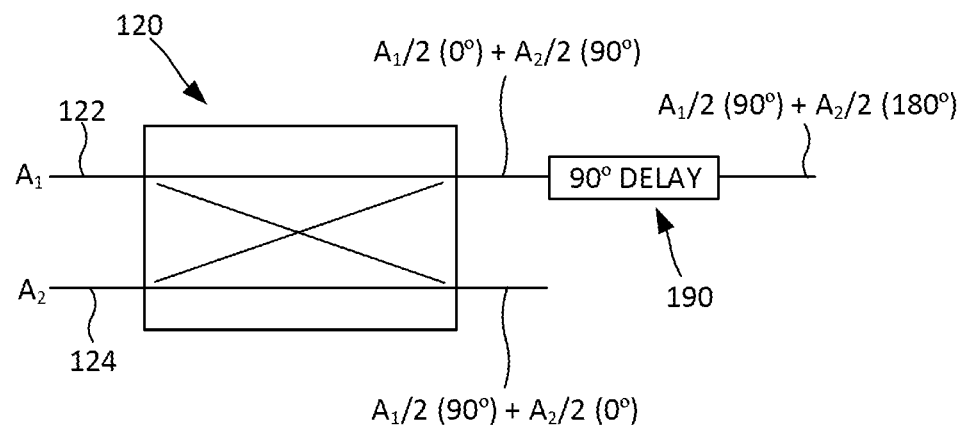
FIG. 2E is a schematic diagram illustrating the 180° hybrid coupler of FIGS. 2A-2D.

The conductive stubs 180 form a bandpass filter. As described above, a delay line 190 is incorporated into the first output transmission line 137. As shown in FIG. 2E, the inclusion of the delay line 190 converts the 90° hybrid coupler 120 into a 180° hybrid coupler. In particular, as shown in FIG. 2E, the 90° hybrid coupler 120 has the "transfer function" of the conventional 90° hybrid coupler 10 shown in FIG. 1A, namely in response to a first and second RF signals $A_1$ and $A_2$ that are input at the respective first and second input ports 122, 124, an RF signal $A_1/2$) $(0°+A_2/2$ $(90°)$ is output at the first output port of the 90° hybrid coupler 120, and an RF signal $A_1/2)(90°+A_2/2$ $(0°)$ is output at the second output port of the 90° hybrid coupler 120. The delay line 190 that is included in the first output transmission line 137 of the 90° hybrid coupler 120 converts the RF signal $A_1/2)(0°+A_2/2$ (90°) that is output from the coupling section 140 to an RF signal $A_1/2)(90°+A_2/2$ (180°), at least for RF signals in the center of the operating frequency band (the phase shift will be less than 90° for RF signals below the center frequency, and greater than 90° for RF signals above the center frequency). Thus, as shown in FIG. 2E, the 180° hybrid coupler 100 will have the transfer function of a conventional 180° hybrid coupler.

Unfortunately, however, the desired phase relationship between the output signals (namely having the two halves of one of the input signals are output in-phase with each other, while the two halves of the other input signal are output out-of-phase by 180°) will only be maintained over a narrow bandwidth. This may be unsatisfactory in certain applications.

By adding the conductive stubs 180, the variation in the amount of phase shift between RF signals at the first and second output ports 126, 128 of 180° hybrid coupler 100 can be drastically reduced. Moreover, the more conductive stubs 180 that are added, the greater the reduction in phase variation. Thus, the inclusion of the conductive stubs 180 may allow the 180° hybrid coupler 100 to operate over a wide frequency band while providing excellent performance.

Figure 3A:
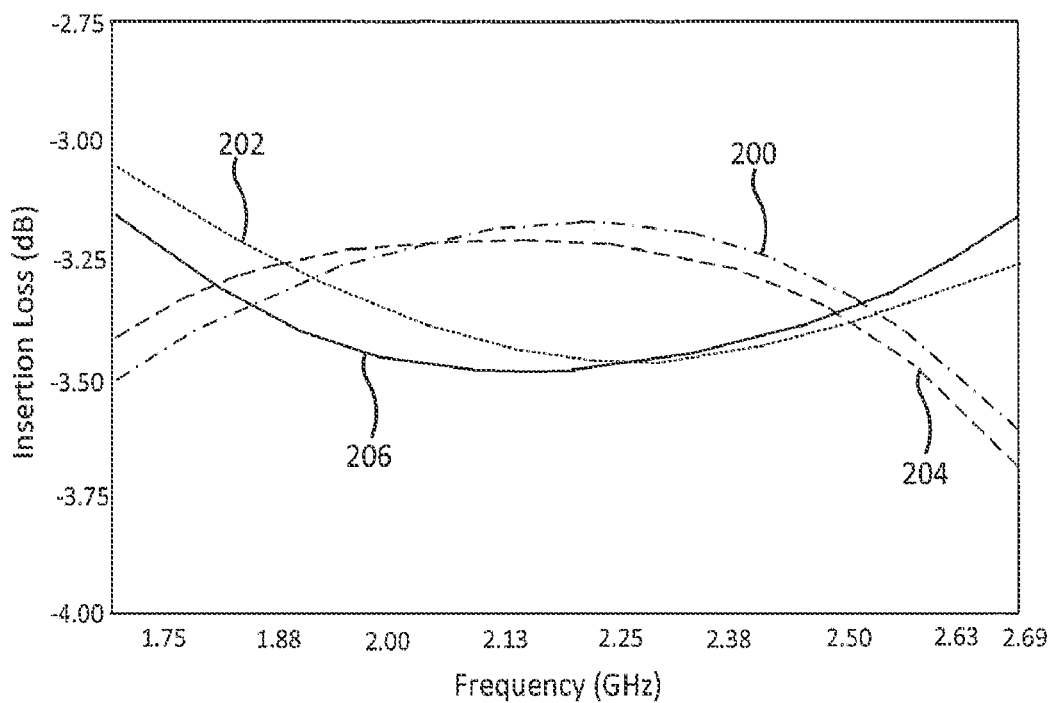
FIG. 3A is a graph illustrating the simulated insertion loss as a function of frequency for the 180° hybrid coupler of FIGS. 2A-2D.
Figure 3B:
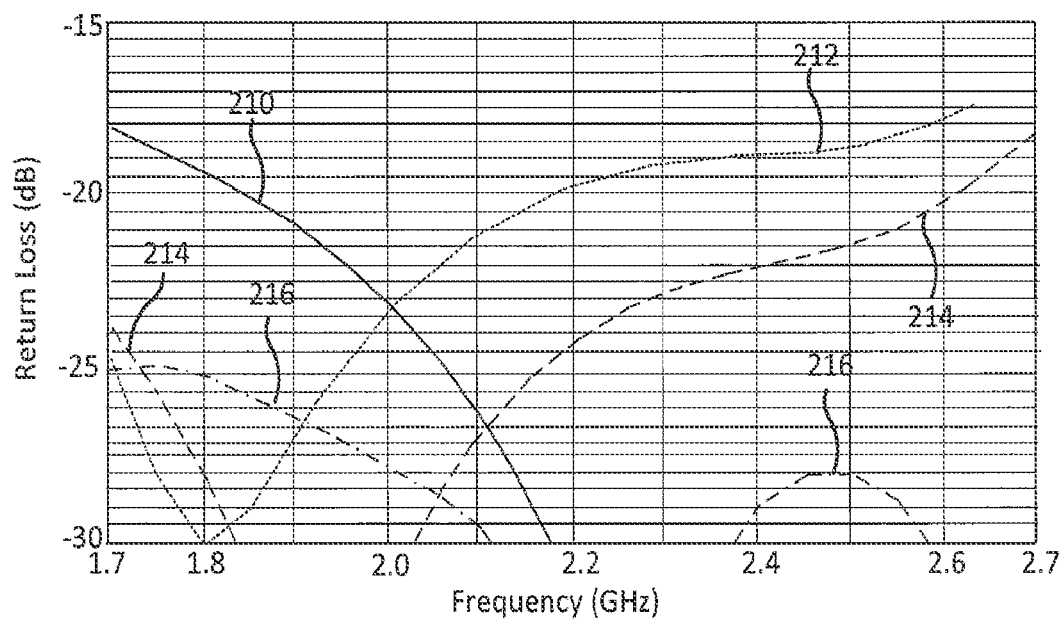
FIG. 3B is a graph illustrating the simulated return loss as a function of frequency for the 180° hybrid coupler of FIGS. 2A-2D.
Figure 3C:
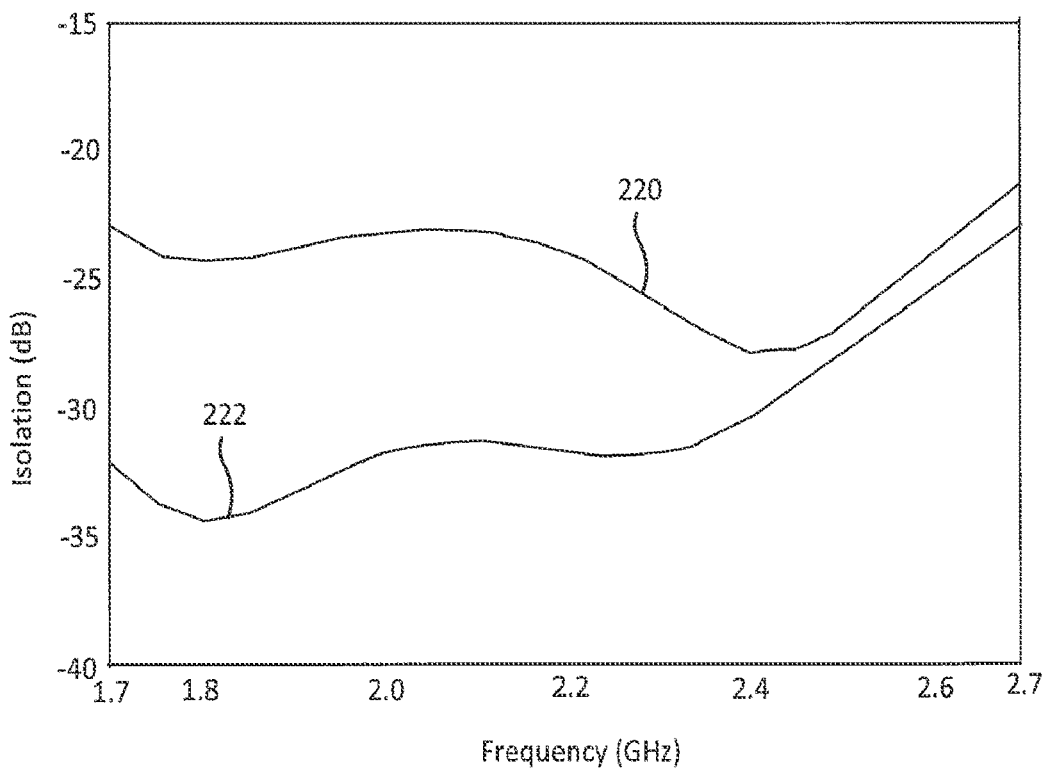
FIG. 3C is a graph illustrating the simulated isolation performance as a function of frequency for the 180° hybrid coupler of FIGS. 2A-2D.
Figure 3D:
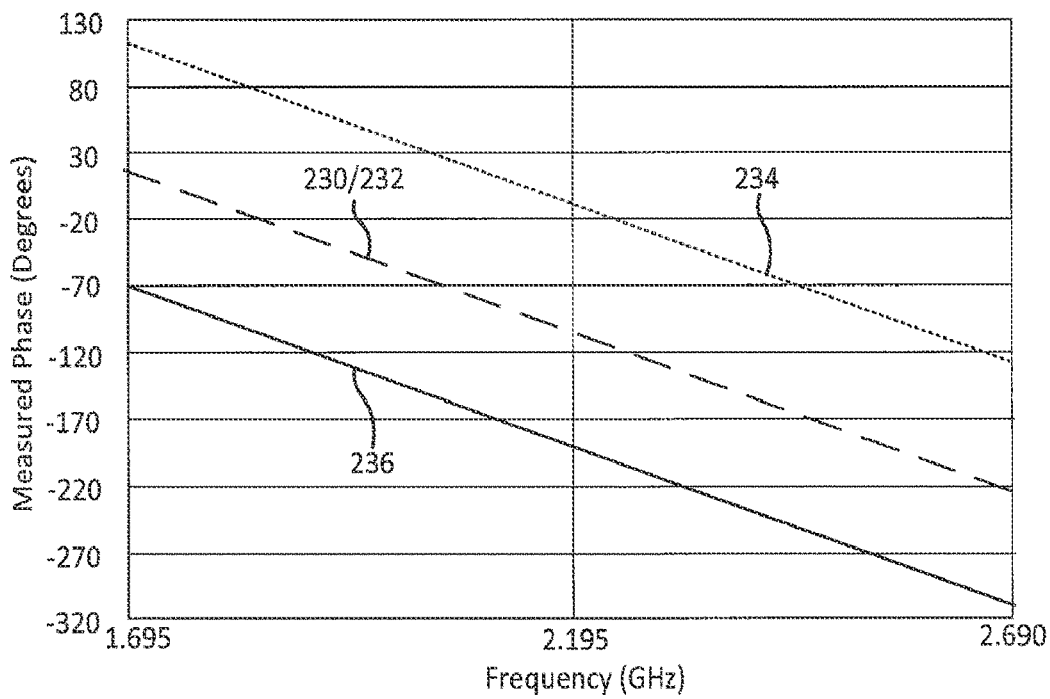
FIG. 3D is a graph illustrating the measured phases of the output signals of the 180° hybrid coupler of FIGS. 2A-2D as a function of frequency.
Figure 3E:
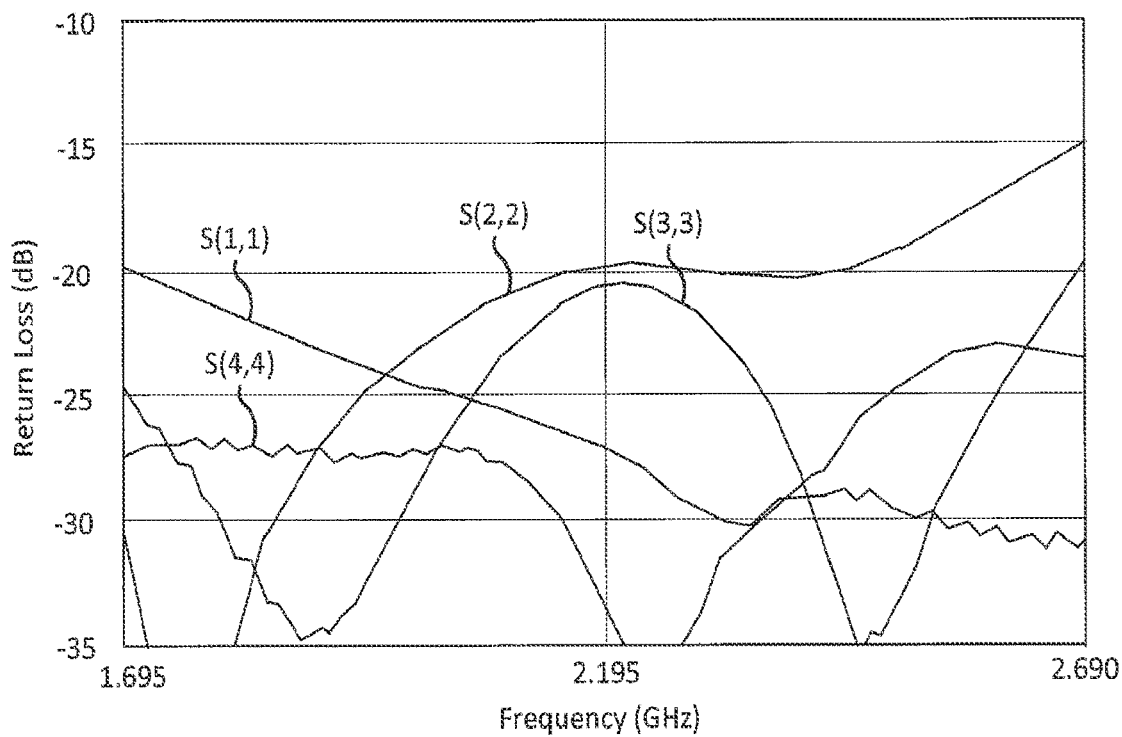
FIG. 3E is a graph illustrating the measured return loss as a function of frequency for the 180° hybrid coupler of FIGS. 2A-2D.

FIGS. 3A-3C are graphs that illustrate the simulated performance of the 180° hybrid coupler 100, while FIGS. 3D and 3E are graphs illustrating the measured performance of 180° hybrid coupler 100.

FIG. 3A is a graph illustrating the simulated insertion loss as a function of frequency for the 180° hybrid coupler 100. Since the 180° hybrid coupler 100 acts a power splitter, the insertion loss necessarily will be at least 3 dB (as the RF power input at an input port is equally split between the two output ports). In FIG. 3A, curve 200 shows the insertion loss for an RF signal input at the first input port 122 as measured at the first output port 126, and curve 206 shows the insertion loss for an RF signal input at the first input port 122 as measured at the second output port 128. Curve 204 shows the insertion loss for an RF signal input at the second input port 124 as measured at the first output port 126, and curve 202 shows the insertion loss for an RF signal input at the second input port 124 as measured at the second output port 128. As shown in FIG. 3A, the insertion loss varies between about 3.1 dB and 3.7 dB across the operating frequency band, and on average is well less than 3.5 dB. The loss of the 180° hybrid coupler 100 (i.e., taking into account that 3 dB of the insertion loss results from the splitting) is about 0.3-0.4 dB on average, especially in the middle of the desired operating frequency band. Thus, the 180° hybrid coupler 100 exhibits good insertion loss performance.

FIG. 3B is a graph illustrating the simulated return loss as a function of frequency for RF signals input at each of the input and output ports 122, 124, 126, 128 of the 180° hybrid coupler 100. In particular, in FIG. 3B, curve 216 shows the return loss for an RF signal input at the first input port 122, curve 210 shows the return loss for an RF signal input at the second input port 124, curve 214 shows the return loss for an RF signal input at the first output port 126, and curve 210 shows the return loss for an RF signal input at the second output port 128. As shown in FIG. 3B, the return loss is less than −16 dB across the entire operating frequency band.

FIG. 3C is a graph illustrating the simulated isolation performance as a function of frequency for the 180° hybrid coupler 100. In FIG. 3C, curve 220 shows the isolation as a function of frequency between the first and second input ports 122 and 124 (i.e., the level of a signal present at the second input port 124 in response to an RF signal input at the first input port 122), and curve 222 shows the isolation between the first and second output ports 126 and 128 (i.e., the level of a signal present at the second output port 128 in response to an RF signal input at the first output port 126). As shown in FIG. 3C, the isolation is better than −21 dB across the entire operating frequency band.

FIG. 3D is a graph illustrating the measured phases of the components of each output signal of the 180° hybrid coupler 100 as a function of frequency in response to a pair of input signals input at the respective input ports 122, 124 of the coupler 100. In FIG. 3D, curve 230 illustrates the phase as a function of frequency of the sub-component of an RF signal that is output at the first output port 126 in response to an RF signal input at the first input port 122, curve 232 illustrates the phase as a function of frequency of the sub-component of an RF signal that is output at the second output port 128 in response to an RF signal input at the first input port 122, curve 234 illustrates the phase as a function of frequency of the sub-component of an RF signal that is output at the first output port 126 in response to an RF signal input at the second input port 124, and curve 236 illustrates the phase as a function of frequency of the sub-component of an RF signal that is output at the second output port 128 in response to an RF signal input at the second input port 124. As shown in FIG. 3D, curves 230 and 232 are right on top of each other, indicating that the two sub-components that are output in response to an RF signal input at the first input port 122 will be almost perfectly in-phase at the outputs of the 180° hybrid coupler 100 for input RF signals anywhere within the operating frequency band. As is further shown in FIG. 3D, curves 234 and 236 are separated by almost exactly 180°, indicating that the two sub-components that are output in response to an RF signal input at the second input port 124 will be almost perfectly out-of-phase for RF signals anywhere within the operating frequency band. The phase error thus varies by less than 2° across the entire operating frequency band and averages less than 1°.

FIG. 3E is a graph illustrating the measured return loss for the 180° hybrid coupler of FIGS. 2A-2D as a function of frequency, with each curve showing the return loss for a respective one of the ports of the 180° hybrid coupler 100. As shown, the measured return loss was less than 15 dB at all four ports across the entire operating frequency band, and less than 20 dB at three of the four ports.

Figure 4:
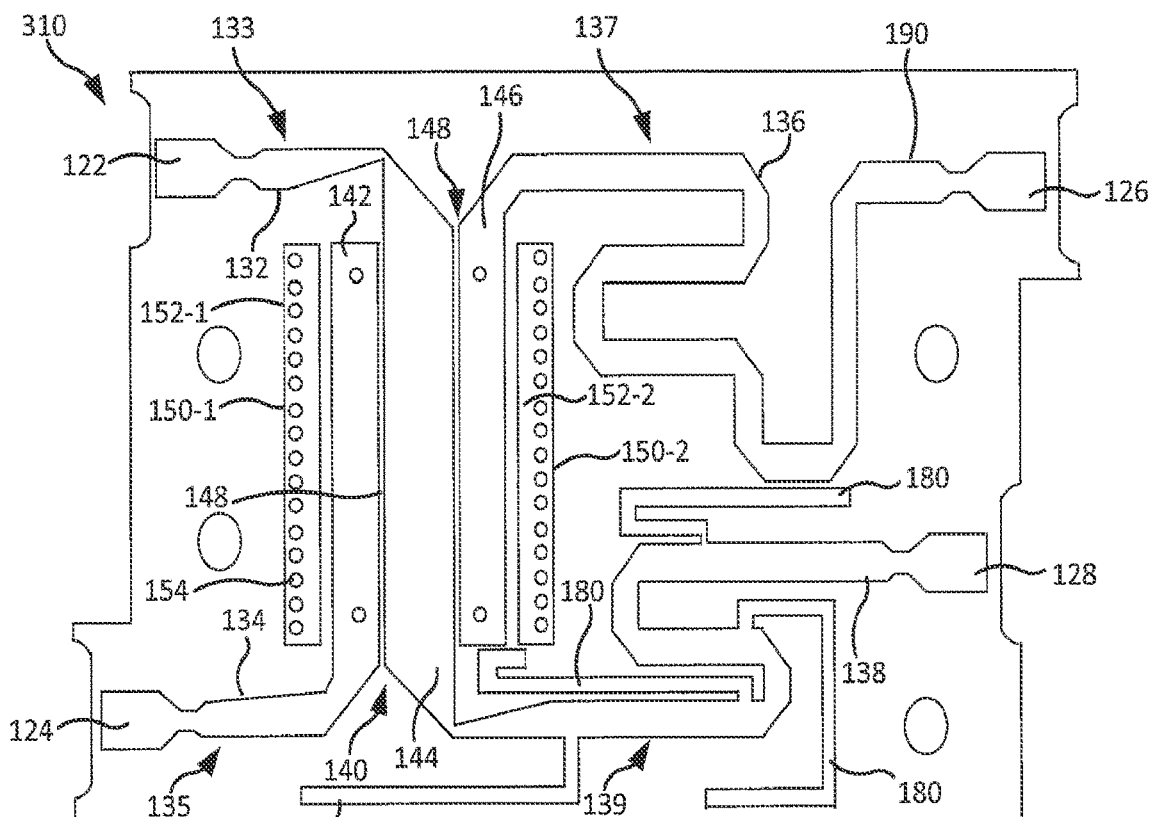
FIG. 4 is a top view of a printed circuit board of a 180° hybrid coupler according to further embodiments of the present invention.

FIG. 4 is a top view of a printed circuit board 310 of a 180° hybrid coupler according to further embodiments of the present invention. As shown in FIG. 4, the printed circuit board 310 is very similar to the printed circuit board 110 discussed above, except that the conductive stubs 180 are implemented as open-circuit stubs as opposed to the short-circuited stubs included in 180° hybrid coupler 100. Consequently, the conductive pads 182 and the conductive vias 184 that are included in the printed circuit board 110 are omitted in printed circuit board 310. It will also be appreciated that in other embodiments some of the conductive stubs 180 may be short-circuit stubs while other of the conductive stubs 180 may be open-circuit stubs.

Figure 5:
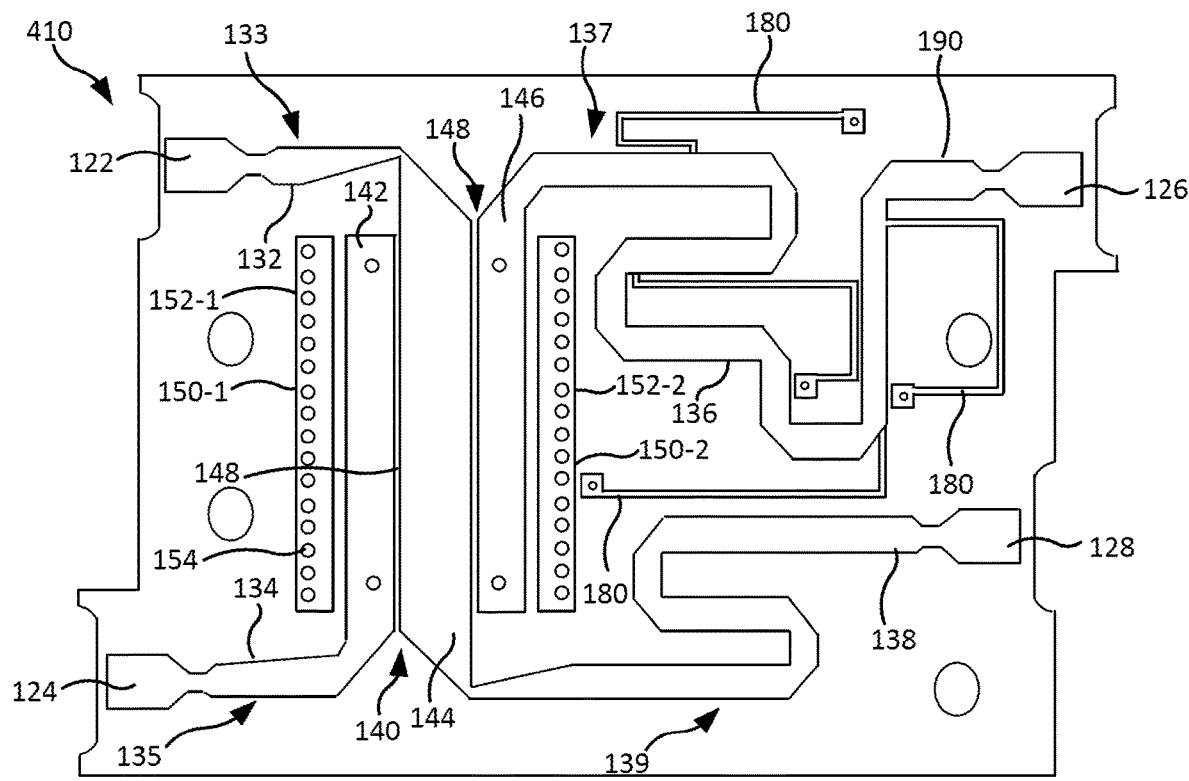
FIG. 5 is a top view of a printed circuit board of a 180° hybrid coupler according to further embodiments of the present invention.

FIG. 5 is a top view of a printed circuit board 410 of a 180° hybrid coupler according to still further embodiments of the present invention. As shown in FIG. 5, the printed circuit board 410 is very similar to the printed circuit board 110 discussed above, except that the conductive stubs 180 extend from the first output transmission line 137 as opposed to the second output transmission line 139 as is the case in the printed circuit board 110. In other embodiments, conductive stubs 180 (which may be either open-circuit or close-circuit stubs) may be provided on both the first and second output transmission lines 137, 139.

Figure 6:
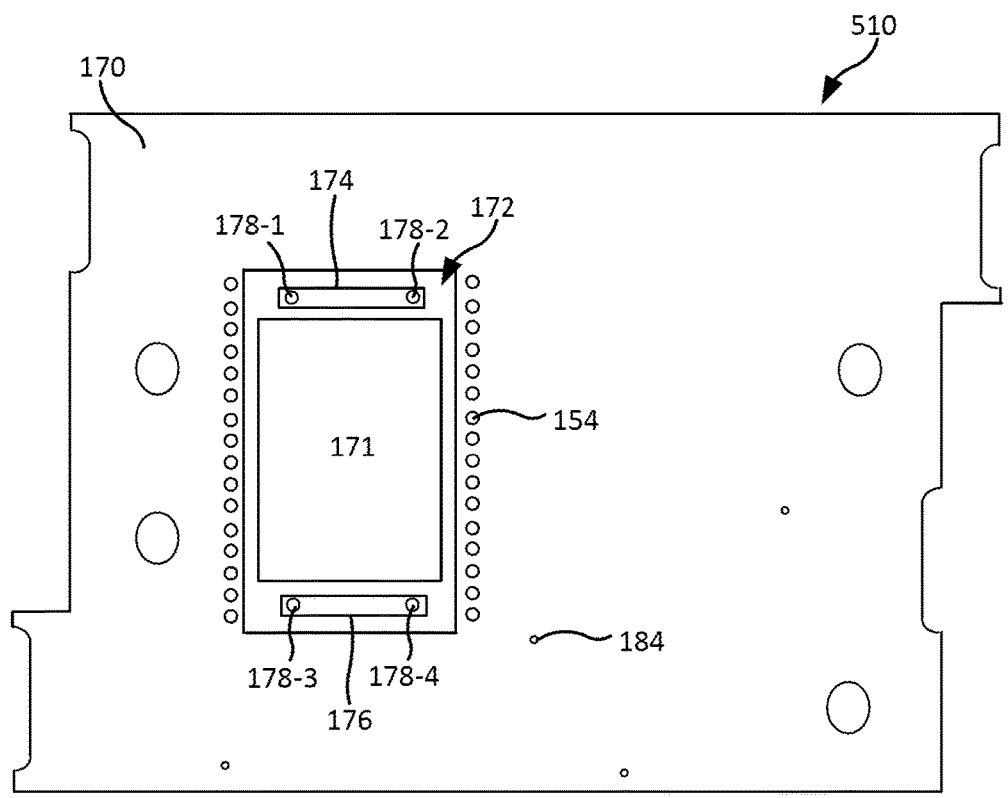
FIG. 6 is a bottom view of a printed circuit board of a 180° hybrid coupler according to further embodiments of the present invention.

FIG. 6 is a bottom view of a printed circuit board 510 of a 180° hybrid coupler according to further embodiments of the present invention. As shown in FIG. 6, the printed circuit board 510 is very similar to the printed circuit board 110 discussed above, except that a central region of the opening 172 in the ground plane layer 170 is metallized to provide a metallized pad 171. The metallized pad 171 is not electrically connected to the ground plane and hence is electrically floating. The metallized pad 171 may reduce leakage of RF energy and hence improve the insertion loss performance of the 180° hybrid coupler that includes printed circuit board 510. In other embodiments, metal that is not part of the printed circuit board 510 may be used instead of the metal pad 171. For example, the printed circuit board 110 discussed above may be mounted on a reflector of a base station antenna and the metal of the reflector may provide a ground plane reference underneath the opening 172 in the ground plane layer 170.

Figure 7:
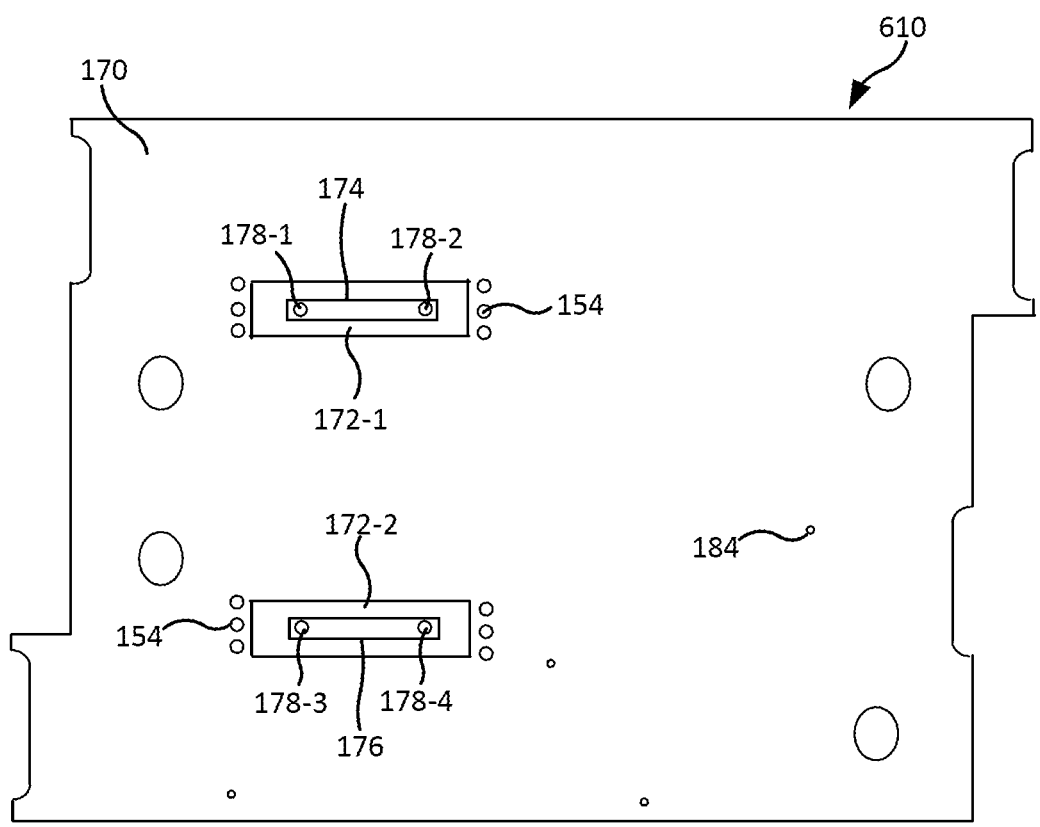
FIG. 7 is a bottom view of a printed circuit board of a 180° hybrid coupler according to further embodiments of the present invention.

FIG. 7 is a bottom view of a printed circuit board 610 of a 180° hybrid coupler according to further embodiments of the present invention. As shown in FIG. 7, the printed circuit board 610 is very similar to the printed circuit board 110 discussed above, except that the metal pad 171 of printed circuit board 610 extends laterally so as to connect to the ground plane layer 170 and act as part of the ground plane layer 170. In this embodiment, many of the conductive vias 154 may be omitted as shown.

While embodiments of the present invention have been described above using hybrid couplers that have an equal power split between output ports as an example, it will be appreciated that embodiments of the present invention are not limited thereto. For example, all of the above described embodiments may also be implemented as hybrid couplers that do not have an equal power split. For example, changing the size of the gap (coupling) can unbalance the distribution of power between different ports to achieve unequal coupling.

The present invention has been described above with reference to the accompanying drawings. The invention is not limited to the illustrated embodiments; rather, these embodiments are intended to fully and completely disclose the invention to those skilled in this art. In the drawings, like numbers refer to like elements throughout. Thicknesses and dimensions of some elements may not be to scale.

Spatially relative terms, such as "under", "below", "lower", "over", "upper", "top", "bottom" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity. As used herein the expression "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including" when used in this specification, specify the presence of stated features, operations, elements, and/or components, but do not preclude the presence or addition of one or more other features, operations, elements, components, and/or groups thereof.

Herein, the terms "attached", "connected", "interconnected", "contacting", "mounted" and the like can mean either direct or indirect attachment or contact between elements, unless stated otherwise.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Aspects of the different embodiments described above may be combined in any fashion to provide additional embodiments.

That Which is claimed is:

1. A 180° hybrid coupler, comprising:
   a 90° hybrid coupler that comprises:
      a coupling section;
      a first input transmission line that is coupled to the coupling section;
      a second input transmission line that is coupled to the coupling section;
      a first output transmission line that is coupled to the coupling section; and
      a second output transmission line that is coupled to the coupling section; and
   a first quarter wavelength conductive stub that is coupled to the second output transmission line.

2. The 180° hybrid coupler of claim 1, wherein the 180° hybrid coupler has an operating frequency band, and wherein a first length of the first output transmission line and a second length of the second output transmission line differ by one quarter of a wavelength of a frequency within the operating frequency band.

3. The 180° hybrid coupler of claim 1, wherein the 90° hybrid coupler is implemented in a printed circuit board that includes a single dielectric layer, the 90° hybrid coupler including a total of three coupled lines in the coupling section that are separated by gaps of at least 0.08 mm.

4. The 180° hybrid coupler of claim 1, further comprising a second quarter wavelength conductive stub that is coupled to the second output transmission line.

5. The 180° hybrid coupler of claim 1, wherein an average width of the first quarter wavelength conductive stub is less than one third an average width of the second output transmission line.

6. The 180° hybrid coupler of claim 1, wherein the first input transmission line, the second input transmission line, the first output transmission line and the second output transmission line are implemented on a first metallization layer of a printed circuit board and a second metallization layer of the printed circuit board includes a metallized ground plane layer that underlies the first input transmission line, the second input transmission line, the first output transmission line and the second output transmission line, the metallized ground plane layer including an opening underneath at least a portion of the coupling section.

7. The 180° hybrid coupler of claim 6, wherein the first input transmission line is directly connected to the second output transmission line, and the second input transmission line is coupled to the first output transmission line by a metallized trace in the opening in the metallized ground plane layer and a pair of conductive vias that extend through a dielectric layer of the printed circuit board.

8. The 180° hybrid coupler of claim 6, further comprising a metal pad that is electrically connected to the metallized ground plane layer underneath the coupling section.

9. A 180° hybrid coupler having an operating frequency band, comprising:
a 90° hybrid coupler having a first input transmission line, a second input transmission line, a first output transmission line and a second output transmission line,
wherein a first length of the first output transmission line and a second length of the second output transmission line differ by approximately one quarter of a wavelength of a center frequency of the operating frequency band, and
wherein a band pass filter is implemented along either the first output transmission line or the second output transmission line.

10. The 180° hybrid coupler of claim 9, wherein the band pass filter comprises at least a first conductive stub that extends from either the first output transmission line or the second output transmission line.

11. The 180° hybrid coupler of claim 10, wherein the band pass filter further comprises a second conductive stub that extends from either the first output transmission line or the second output transmission line, and wherein the second conductive stub has a length that is approximately one quarter of the wavelength of the center frequency of the operating frequency band.

12. The 180° hybrid coupler of claim 10, wherein an average width of the first conductive stub is less than one third an average width of the second output transmission line.

13. The 180° hybrid coupler of claim 9, wherein the first input transmission line, the second input transmission line, the first output transmission line and the second output transmission line are implemented on a first metallization layer of a printed circuit board and a second metallization layer of the printed circuit board includes a metallized ground plane layer that underlies the first input transmission line, the second input transmission line, the first output transmission line and the second output transmission line, the metallized ground plane layer including an opening underneath at least a portion of a coupling section of the 90° hybrid coupler.

14. The 180° hybrid coupler of claim 13, wherein the first metallization layer includes a first conductive region on an input side of the coupling section and a second conductive region on an output side of the coupling section, wherein each of the first and second conductive regions are electrically coupled to the metallized ground plane layer by respective first and second sets of conductive vias that extend through the dielectric layer of the printed circuit board.

15. The 180° hybrid coupler of claim 13, further comprising a metal layer that is electrically connected to the metallized ground plane layer underneath the coupling section.

16. A 180° hybrid coupler, comprising:
a printed circuit board that includes a top metallization layer and a bottom metallization layer and a dielectric layer therebetween, and first and second conductive vias, the top metallization layer including:
a first input transmission line;
a second input transmission line;
a first output transmission line;
a second output transmission line;
a first coupling line;
a second coupling line;
a third coupling line, the second coupling line positioned between the first coupling line and the third coupling line; and
a first conductive stub that is coupled to the second output transmission line;
the bottom metallization layer including:
a ground plane that extends at least partially underneath the first input transmission line, the second input transmission line, the first output transmission line and the second output transmission line, the ground plane including at least one opening underneath at least a portion of the second coupling line; and
a first metallized trace that is within the at least one opening,
wherein the first conductive via electrically connects the first coupling line to the first metallized trace and the second conductive via electrically connects the third coupling line to the first metallized trace.

17. The 180° hybrid coupler of claim 16, wherein the hybrid coupler has an operating frequency band, and wherein a first length of the first output transmission line and a second length of the second output transmission line differ by approximately one quarter of a wavelength of a center frequency of the operating frequency band.

18. The 180° hybrid coupler of claim 16, wherein the top metallization layer further comprises a second conductive stub that is coupled to the second output transmission line.

19. The 180° hybrid coupler of claim 16, wherein an average width of the first conductive stub is less than one third an average width of the second output transmission line.

20. The 180° hybrid coupler of claim 19, wherein the top metallization layer further includes a first conductive region on an input side of the coupling section and a second conductive region on an output side of the coupling section, wherein each of the first and second conductive regions are electrically coupled to the ground plane by respective first and second sets of conductive vias that extend through the dielectric layer of the printed circuit board.

* * * * *